(12) United States Patent
Zhu et al.

(10) Patent No.: US 11,329,049 B2
(45) Date of Patent: May 10, 2022

(54) MEMORY TRANSISTOR WITH CAVITY STRUCTURE

(71) Applicant: Changxin Memory Technologies, Inc., Anhui (CN)

(72) Inventors: Rongfu Zhu, Hefei (CN); Dingyou Lin, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 95 days.

(21) Appl. No.: 16/849,217

(22) Filed: Apr. 15, 2020

(65) Prior Publication Data
US 2020/0243533 A1  Jul. 30, 2020

Related U.S. Application Data

(63) Continuation of application No. PCT/CN2018/111535, filed on Oct. 24, 2018.

(30) Foreign Application Priority Data

Oct. 24, 2017  (CN) .......................... 201711003239.4

(51) Int. Cl.
*H01L 27/108* (2006.01)
*H01L 21/764* (2006.01)
*H01L 29/06* (2006.01)

(52) U.S. Cl.
CPC ...... *H01L 27/10823* (2013.01); *H01L 21/764* (2013.01); *H01L 27/10876* (2013.01); *H01L 29/0653* (2013.01)

(58) Field of Classification Search
CPC ............. H01L 21/76264; H01L 21/764; H01L 27/10823; H01L 27/10876; H01L 29/0649; H01L 29/4236
See application file for complete search history.

(56) References Cited

U.S. PATENT DOCUMENTS 8,697,525 B2  4/2014 Kim et al.
9,859,285 B2  1/2018 Wang
(Continued)

FOREIGN PATENT DOCUMENTS

| CN | 102543944 A | 7/2012 |
| CN | 106952919 A | 7/2017 |

(Continued)

OTHER PUBLICATIONS

PCT International Search Report and the Written Opinion dated Jan. 14, 2019, issued in related International Application No. PCT/CN2018/111535 (7 pages).

(Continued)

*Primary Examiner* — Hoai V Pham
(74) *Attorney, Agent, or Firm* — Sheppard Mullin Richter & Hampton LLP (57) ABSTRACT

A memory transistor comprises a substrate comprising a first surface and a second surface opposing the first surface, the substrate further comprising a first trench having an opening formed in the first surface; a first dielectric layer formed on an inner surface of the first trench; a gate layer formed on the first dielectric layer in the first trench, the gate layer having a top surface lower than the first surface; and a second dielectric layer filled in the first trench and located on the top surface of the gate layer, the second dielectric layer covering the gate layer and connecting to the first dielectric layer, the second dielectric layer having a cavity formed therein.

17 Claims, 12 Drawing Sheets

(56) References Cited

U.S. PATENT DOCUMENTS

2012/0049266 A1     3/2012   Oh et al.
2014/0217545 A1     8/2014   Kim et al.
2015/0311276 A1   10/2015   Kim et al.
2018/0301456 A1* 10/2018   Cho ................. H01L 27/10876

FOREIGN PATENT DOCUMENTS

| CN | 106992156 A | 7/2017 |
| CN | 107634103 A | 1/2018 |
| CN | 107731907 A | 2/2018 |
| CN | 207320123 U | 5/2018 |

OTHER PUBLICATIONS

First Search dated Apr. 16, 2018, issued in related Chinese Application No. 201711003239.4 (1page).

* cited by examiner

MEMORY TRANSISTOR WITH CAVITY STRUCTURE

CROSS-REFERENCE TO RELATED APPLICATIONS

This application is a continuation application of International Patent Application No. PCT/CN2018/111535, filed on Oct. 24, 2018, which is based on and claims priority to Chinese Patent Application No. 201711003239.4, filed with the State Intellectual Property Office on Oct. 24, 2017 and entitled "MEMORY TRANSISTOR, FABRICATION METHOD THEREOF AND SEMICONDUCTOR DEVICE," which are incorporated herein by reference in their entirety.

TECHNICAL FIELD

The present disclosure relates to the field of semiconductor technology and, in particular, to a memory transistor, a method for fabricating the memory transistor and a semiconductor device.

BACKGROUND

Integrated circuits (ICs) have evolved from integrating dozens of components on a single chip to integrating millions of components. The performance and complexity of ICs have far exceeded the original expectations. To further enhance complexity and circuit density (the number of components that can be accommodated within certain area of a chip), the feature size, also known as the geometry of IC components has become smaller and smaller. Increasing circuit density not only improves ICs' complexity and performance, but also lowers the price of the ICs for consumers. To further shrink the feature size of IC components is challenging because every process involved in IC fabrication has a limit. In other words, if a process is required to perform at a feature size smaller than its limit, then either the process or the component needs to be changed. In addition, traditional processes and materials often lag behind increasingly high demands of IC design.

Dynamic random access memories (DRAMs) are the most common system memories. Although performance of DRAMs, which is a type of semiconductor devices, has been greatly developed, there is still a need for its further development. DRAM with buried gates is a commonly-used structure. However, the performance of such DRAM is limited as the buried gates tend to be affected by overlying dielectric layers.

SUMMARY OF THE DISCLOSURE

The present disclosure provides a memory transistor with improved performance, as well as a method of fabricating the memory transistor.

According to one aspect of the present disclosure, the memory transistor may comprise:

a substrate comprising a first surface and a second surface opposing the first surface, the substrate further comprising a first trench having an opening formed in the first surface;

a first dielectric layer formed on an inner surface of the first trench;

a gate layer formed on the first dielectric layer in the first trench, the gate layer having a top surface lower than the first surface; and a second dielectric layer filled in the first trench and located on the top surface of the gate layer, the second dielectric layer covering the gate layer and connecting to the first dielectric layer, the second dielectric layer having a cavity formed therein, wherein the substrate further comprises a source region and a drain region, each of the source and drain regions located on one side of the first trench, and wherein the cavity is between the source region and the drain region.

In some embodiments, the cavity may account for 5% or more of a volume of the second dielectric layer.

In some embodiments, the cavity may comprise a maximum height measured perpendicular to the first surface and a maximum width measured parallel to the first surface, wherein the maximum height is greater than the maximum width.

In some embodiments, the first dielectric layer may be made of a material comprising silicon oxide.

In some embodiments, the second dielectric layer may be made of a material comprising any one of silicon oxide, silicon nitride and silicon oxynitride, or combinations thereof.

In some embodiments, a depth of bottoms of the source and drain regions with respect to the first surface in the substrate may be greater than a depth of the top surface of the gate layer with respect to the first surface in the substrate.

In some embodiments, the memory transistor may comprise a plurality of first trenches, two adjacent ones of the first trenches sharing one of the source region and the drain region.

In some embodiments, the substrate may further comprise second trenches each surrounding one of the source and drain regions, the second trenches being filled with an insulating material.

According to another aspect of the present disclosure, a method for fabricating a memory transistor may comprise:

providing a substrate comprising a first surface and a second surface opposing the first surface;

forming a first trench in the substrate, the first trench having an opening formed in the first surface;

forming a first dielectric layer on an inner surface of the first trench;

forming a gate layer on the first dielectric layer in the first trench, the gate layer having a top surface lower than the first surface;

filling the first trench with a second dielectric layer, the second dielectric layer located on the top surface of the gate layer, the second dielectric layer covering the gate layer and connecting to the first dielectric layer, the second dielectric layer having a cavity formed therein, and subsequent to the filling of the second dielectric layer, forming a source region and a drain region in the substrate, each of the source and drain regions located on one side of the first trench, and wherein the cavity is between the source region and the drain region.

In some embodiments, the cavity may account for 5% or more of a volume of the second dielectric layer.

In some embodiments, a depth of bottoms of the source and drain regions with respect to the first surface in the substrate may be greater than a depth of the top surface of the gate layer with respect to the first surface in the substrate.

In some embodiments, the method may further comprise, prior to the formation of the first trench in the substrate:

forming second trenches in the substrate, each of the second trenches surrounding one of the source and drain regions, the second trenches having an opening toward the first surface and a bottom away from the first surface; and filling the second trenches with an insulating material.

According to yet another aspect, the present disclosure may provide a semiconductor device, comprising:

a substrate comprising a first surface and a second surface opposing the first surface, the substrate further comprising a first trench having an opening formed in the first surface and a bottom away from the first surface;

a first material layer formed on an inner surface of the first trench;

a second material layer formed on the first material layer in the first trench, the second material layer having a first top surface lower than the first surface; and a third material layer formed within the first trench and covering the second material layer and the first material layer, the third material layer having a second top surface and having a cavity formed therein, the cavity located between the first top surface and the second top surface, wherein the second material layer is a gate layer, the gate layer used to construct a memory transistor, and wherein the substrate further comprises a source region and a drain region, each of the source and drain regions located on one side of the first trench, and wherein the cavity is between the source region and the drain region.

In the memory transistor provided in the present disclosure, the second dielectric layer is formed within the first trench and overlies the first dielectric layer. Moreover, the second dielectric layer has a cavity formed therein. As a result, the memory transistor has a significantly reduced mechanical stress as well as fewer defects that may be introduced into the second dielectric layer by thermal processes. Furthermore, the introduction of the cavity can reduce parasitic capacitance and hence improve performance of the memory transistor.

A list of reference numerals in the drawings is presented below:

| | |
|---|---|
| 1, 10 | A substrate |
| 2, 14 | A gate layer |
| 3 | A gate dielectric layer |
| 4, 12 | An isolation structure |
| S | A source region |
| D | A drain region |
| 11 | A trench |
| 101 | A first surface |
| 102 | A second surface |
| 13 | A first dielectric layer |
| 15 | A second dielectric layer |
| 16, 161, 162, 163 | A cavity |
| 17 | A second dielectric layer |

DETAILED DESCRIPTION

Memory transistors, fabrication methods thereof and semiconductor devices according to the present disclosure will be described in greater detail below with reference to the accompanying drawings, which present preferred embodiments of the disclosure. It should be appreciated that those skilled in the art can make changes to the disclosure disclosed herein while still obtaining the beneficial results thereof. Therefore, the following description shall be construed as being intended to be widely known by those skilled in the art rather than as limitation to the disclosure.

The present disclosure will be further described in the following paragraphs by way of examples with reference to the accompanying drawings. Features and advantages of the disclosure will be more apparent from the following detailed description, and from the appended claims. The accompanying drawings are provided in a simplified form not necessarily presented to scale, facilitating easy and clear explanation of illustrative examples of the disclosure.

In the following description, when any layer (or film), region, pattern or structure is described as being "on" (or overlying) a substrate, another layer (or film), another region, a welding pad and/or another pattern, the layer, region, pattern or structure may be disposed directly on the substrate, the other layer (or film), the other region, the welding pad and/or the other pattern, or alternatively with one or more other layers inserted therebetween. In addition, any layer described as being "under" (or underlying) another layer may be disposed directly under the other layer, or alternatively with one or more yet other layers inserted therebetween. Reference to the overlying and underlying layers may be made in the appended figures.

Figure 1:
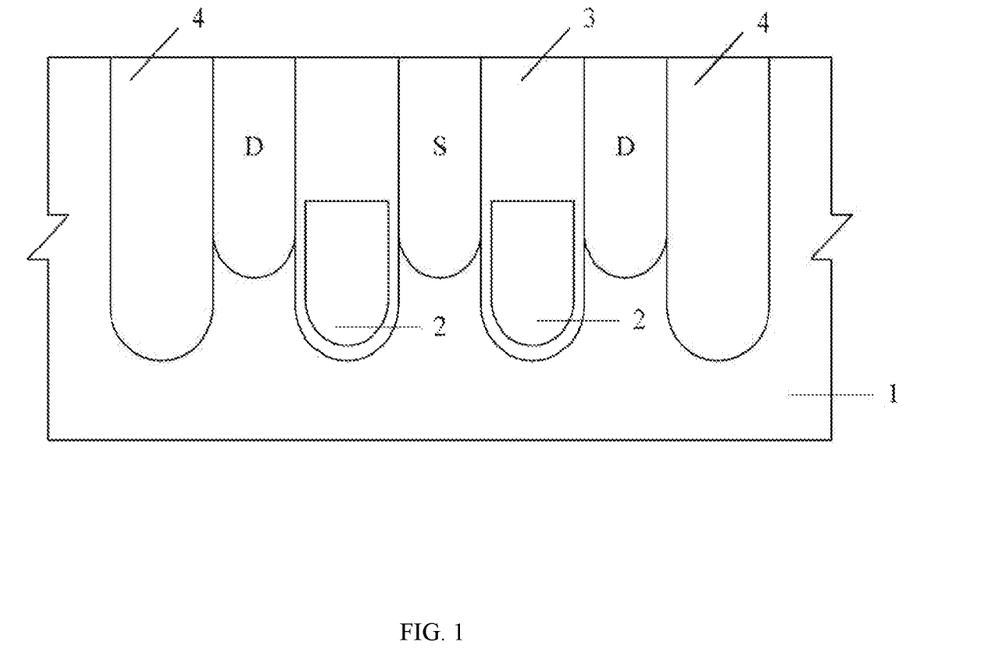
FIG. 1 is a structural schematic diagram of a memory transistor in accordance with some embodiments of the present disclosure.

FIG. 1 is a structural schematic diagram of a memory transistor in accordance with some embodiments of the present disclosure. As shown in FIG. 1, the memory transistor may include a substrate 1 and isolation structures 4 formed in the substrate 1. The isolation structures 4 may be formed, for example, by trench etching and filling processes. The memory transistor may also include a gate structure formed between the isolation structures 4. For example, the gate structure may be a buried-gate structure, which includes a gate layer 2 and a gate dielectric layer 3 covering the gate layer 2. The memory transistor may further include active areas formed on both sides of the gate structure. In other words, the gate structure is sandwiched between the active areas. The active areas may include a source region S and a drain region D. For example, the source region S and the drain region D are located on the two sides of the gate structure respectively. In some embodiments, the active regions may be obtained by implanting ions which are selected according to practical needs.

In the buried-gate structure, because the gate layer 2 is covered by the gate dielectric layer 3, and the gate dielectric layer 3 is a uniform solid film, the gate layer 2 may have a high effect dielectric constant and hence a significant parasitic capacitance. Moreover, such a gate dielectric layer 3 may introduce a relatively high mechanical stress (e.g., via a Chemical mechanical planarization (CMP) process or the like) and suffer from defects caused by thermal processes (e.g., generating fine particles in the gate dielectric layer 3, which may cause electrical leakage or other adverse consequences).

Figure 2:
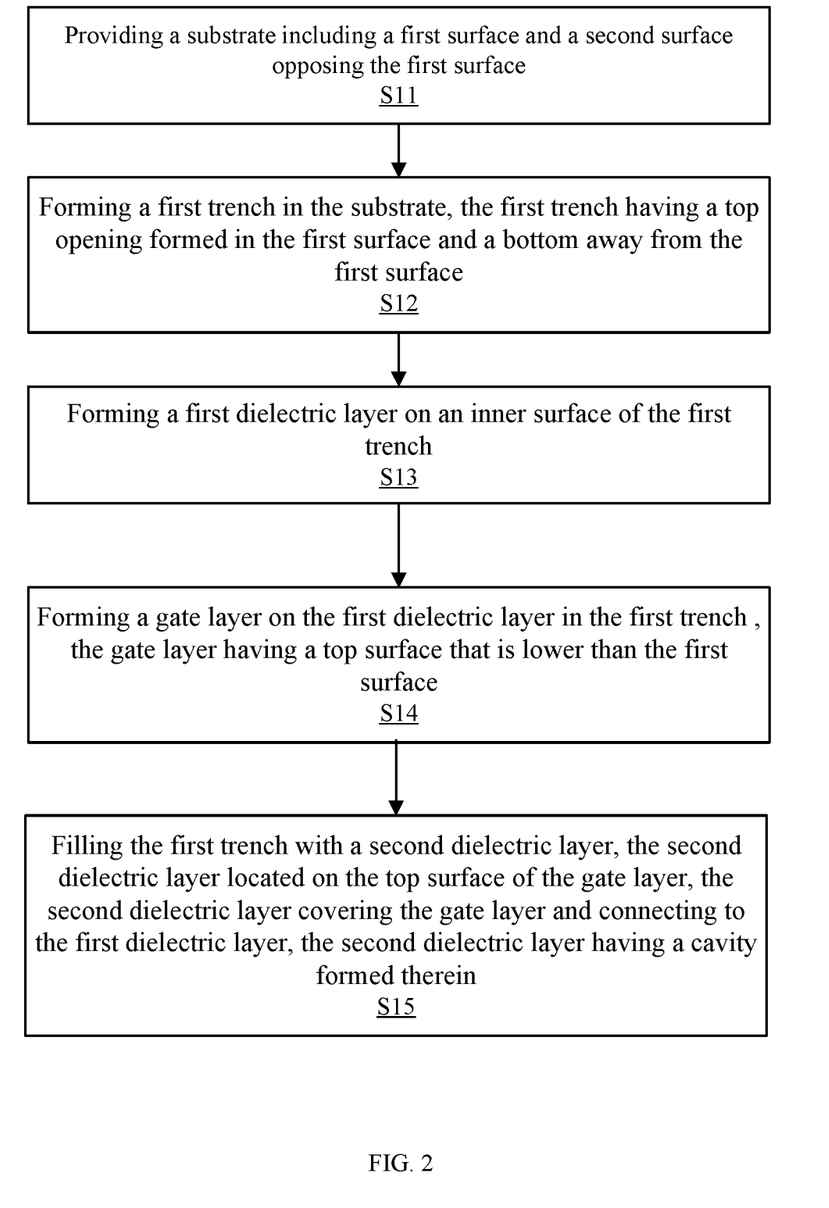
FIG. 2 is a flowchart illustrating a method for fabricating a memory transistor in accordance with some embodiments of the present disclosure.

The present disclosure provides a memory transistor to ameliorate the above deficiencies. Referring to FIG. 2, a flowchart illustrates a method for fabricating a memory transistor in accordance with some embodiments of the present disclosure, which includes the following steps of:

Step S11, providing a substrate including a first surface and a second surface opposing the first surface;

Step S12, forming a first trench in the substrate, the first trench having a top opening formed in the first surface;

Step S13, forming a first dielectric layer on an inner surface of the first trench;

Step S14, forming a gate layer on the first dielectric layer in the first trench, the gate layer having a top surface that is lower than the first surface; and Step S15, filling the first trench with a second dielectric layer, the second dielectric layer located on the top surface of the gate layer, the second dielectric layer covering the gate layer and connecting to the first dielectric layer, the second dielectric layer having a cavity formed therein.

FIGS. 3-11 are schematic diagrams illustrating structures resulting from the steps in the method for fabricating a memory transistor of FIG. 2 in accordance with some embodiments of the present disclosure.

Figure 3:
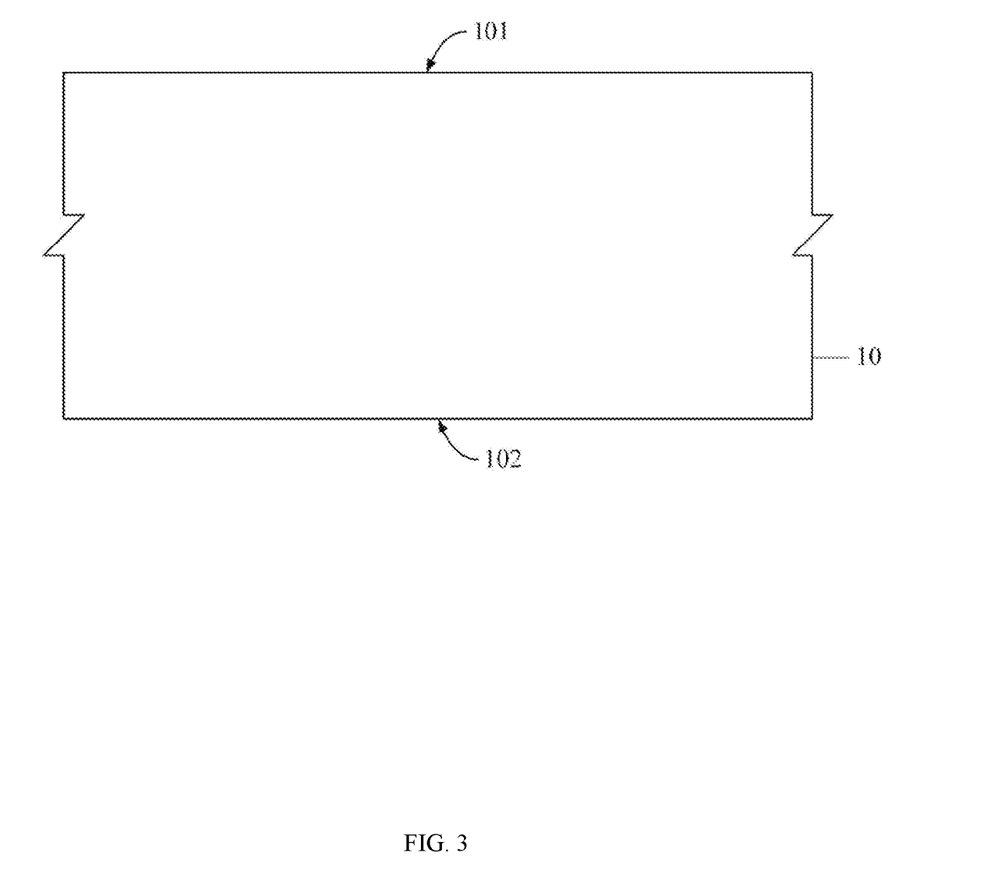
FIG. 3 is a schematic diagram showing a provided substrate in accordance with some embodiments of the present disclosure.

Referring to FIG. 3, a schematic diagram shows a provided substrate in accordance with some embodiments of the present disclosure. In some embodiments, the substrate may be obtained through the step S11 of the method shown in FIG. 2. Alternatively, the substrate may be obtained through a different method.

In step S11 of FIG. 2, a substrate 10 is provided, which has a first surface 101 and a second surface 102 opposing the first surface 101. In some embodiments, the substrate 10 may be an undoped monocrystalline silicon substrate, a doped monocrystalline silicon substrate, a silicon-on-insulator (SOI) substrate or the like. For example, the substrate 10 may be fabricated by using monocrystalline silicon material. In some embodiments, the substrate 10 may also include other structures or components, such as buried layers (not shown in FIG. 3). Yet other structures or components may be possible and appreciated by one skilled in the related art.

Figure 4:
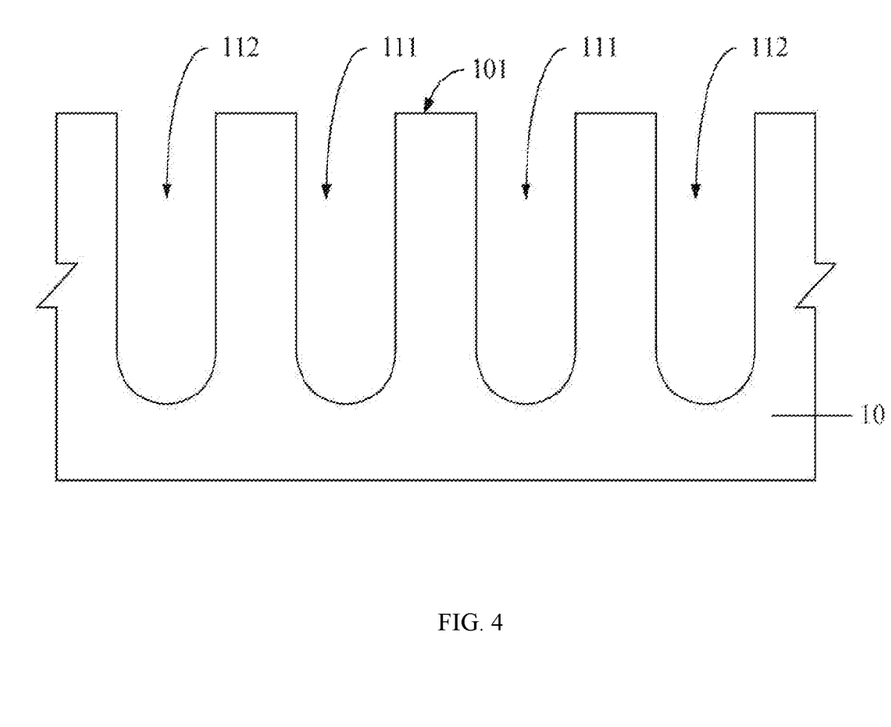
FIG. 4 is a schematic diagram showing formation of first trenches and second trenches in a substrate in accordance with some embodiments of the present disclosure.

Referring to FIG. 4, a schematic diagram shows the formation of first trenches and second trenches in a substrate in accordance with some embodiments of the present disclosure. In some embodiments, the first and second trenches may be obtained through the step S12 of the method shown in FIG. 2. Alternatively, the first trenches and second trenches may be obtained through other methods.

In step S12 of FIG. 2, multiple first trenches 111 are formed in the substrate 10. Each of the first trench 111 has a top opening formed in the first surface 101. In some embodiments, the first trenches 111 and/or the top openings of the first trenches 111 may be formed via photolithography and etching processes. In some embodiments, prior to the formation of the first trenches 111, multiple second trenches 112 may be formed. Each of the second trenches 112 may have an opening toward the first surface 101 and a bottom facing away from the first surface 101. In some embodiments, the first trenches 111 and the second trenches 112 may have identical specifications. To achieve a better isolation, each of the second trenches 112 may have a depth that is greater than a depth of the first trench 111, and the second trenches 112 may surround the first trench 111, a source region S and a drain region D.

Figure 5:
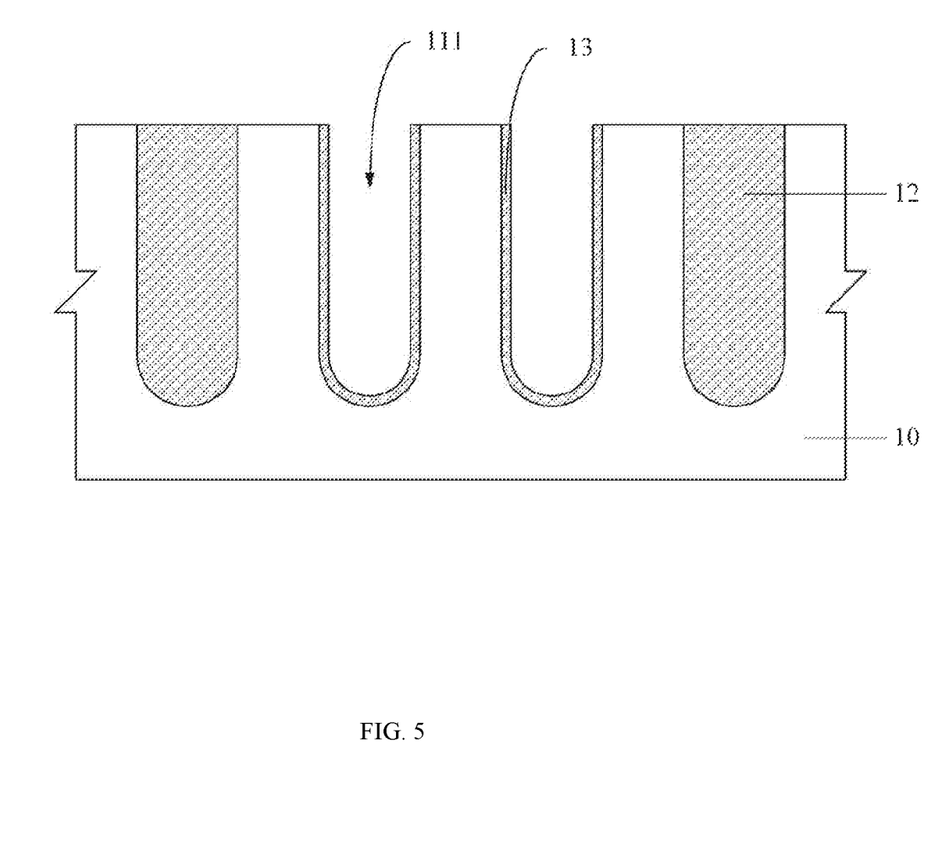
FIG. 5 is a schematic diagram showing formation of a first dielectric layer in accordance with some embodiments of the present disclosure.

As shown in FIG. 5 (which will be described in further detail below), the second trenches 112 may be filled with an insulating material to form isolation structures 12. In some embodiments, multiple trenches may be formed, among which, the outermost ones (e.g., the outermost column or row of the trenches) may be prepared as the second trenches 112 for the subsequent formation of isolation structures, and the remaining trenches may be prepared as the first trenches 111 for the subsequent formation of buried-gate structures.

Referring now to FIG. 5, a schematic diagram shows formation of a first dielectric layer in accordance with some embodiments of the present disclosure. In some embodiments, the first dielectric layer may be obtained through the step S13 of the method shown in FIG. 2. Alternatively, the first dielectric layer may be obtained through a different method.

In step S13 of FIG. 2, a first dielectric layer 13 may be formed on an inner surface of one or each of the first trenches 111. In some embodiments, the first dielectric layer 13 may be formed from a material such as silicon oxide by a chemical vapor deposition process. In some embodiments, the thickness of the first dielectric layer 13 may range from 1 nm to 200 nm. Alternatively, the thickness of the first dielectric layer 13 may be other values selected based on practical needs.

In some embodiments, with the isolation structures 12 formed in the second trenches 112, the formation of the first dielectric layer 13 does not affect the second trenches 112. In some embodiments, the first dielectric layer 13 may serve as a gate oxide layer. The isolation structures 12 may be made of a material comprising at least one of silicon oxide, silicon nitride and silicon oxynitride.

After the first dielectric layer 13 and/or the isolation structures 12 are formed, a planarization process such as a chemical mechanical polishing process may be performed on them to make the top surfaces of the first dielectric layer 13 and/or the isolation structures 12 flush with the first surface 101. In some embodiments, the first dielectric layer 13 and the isolation structures 12 may be formed in an arbitrary order.

Figure 6:
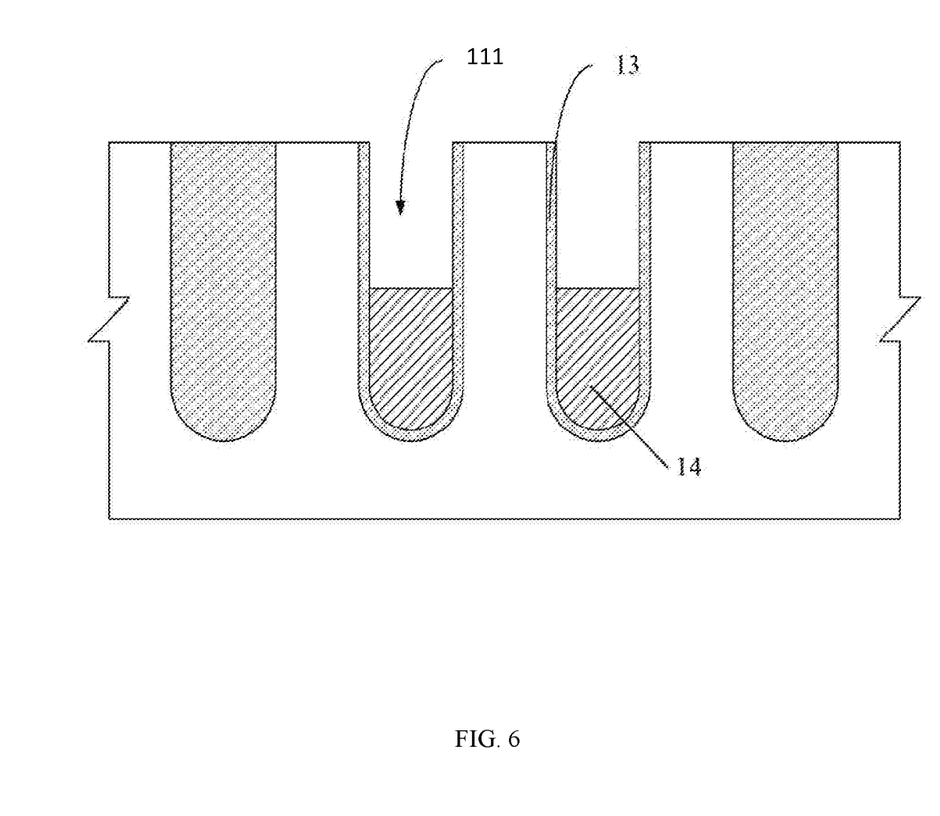
FIG. 6 is a schematic diagram showing formation of a gate layer in accordance with some embodiments of the present disclosure.

Referring to FIG. 6, a schematic diagram shows formation of a gate layer in accordance with some embodiments of the present disclosure. In some embodiments, the gate layer may be obtained through the step S14 of the method shown in FIG. 2. Alternatively, the gate layer may be obtained through a different method.

In step S14 of FIG. 2, a gate layer 14 is formed within the first trench 11 and overlies the first dielectric layer 13 such that a top surface of the gate layer 14 is lower than the first surface 101. The gate layer 14 may be formed of, for example, a metallic material. Alternatively, it may be formed of another material such as polycrystalline silicon. The metallic material allows a better thermal stability and an appropriate work function. Further, the metallic material is not limited to a single metal, but may also be a binary metallic alloy, a conductive metal oxide, a metal silicide, a metal nitride, a metal nitro-silicide, a metal aluminum nitride, etc.

Figure 7:
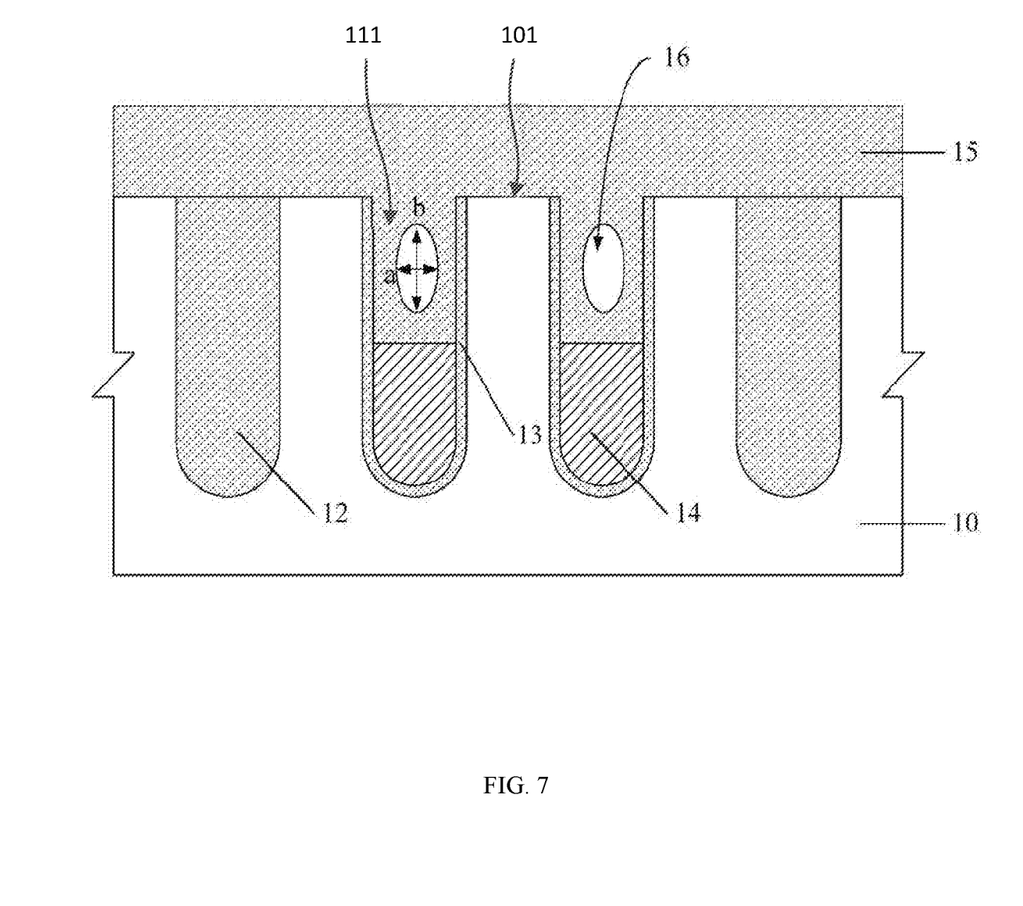
FIGS. 7 and 8 are schematic diagrams showing formation of a second dielectric layer in accordance with some embodiments of the present disclosure.
Figure 8:
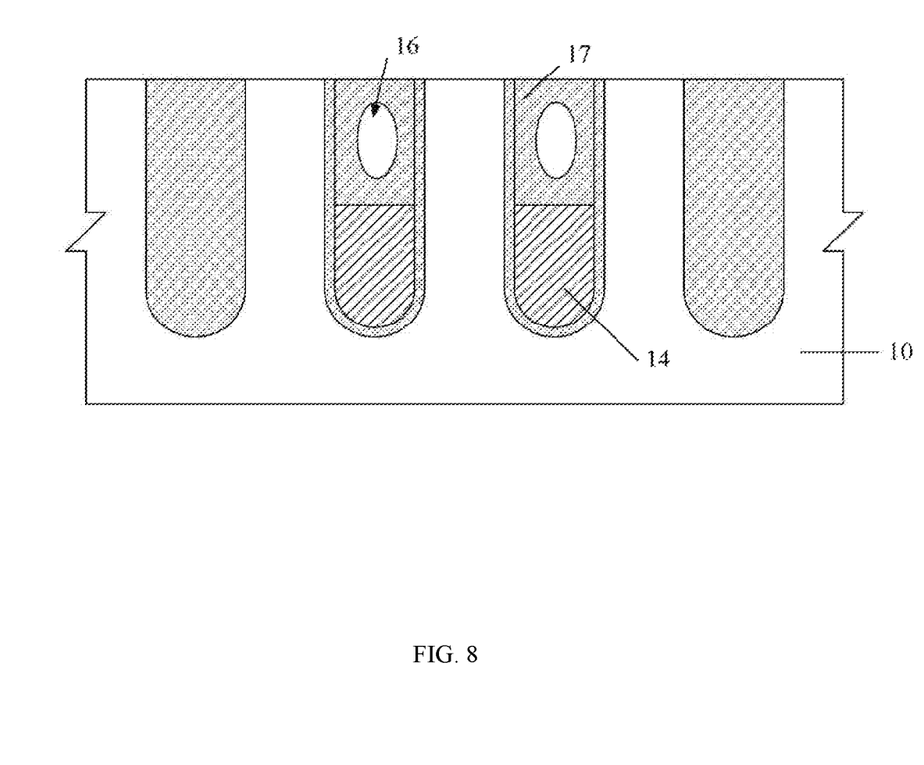

Referring to FIGS. 7 and 8, schematic diagrams show formation of a second dielectric layer in accordance with some embodiments of the present disclosure. In some embodiments, the second dielectric layer may be obtained through the step S15 of the method shown in FIG. 2. Alternatively, the second dielectric layer may be obtained through a different method.

In step S15, the first trench 11 is filled with a second dielectric layer 15 and the second dielectric layer 15 is located on the top surface of the gate layer 14. The second dielectric layer 15 covers the gate layer 14 and connects to the first dielectric layer 13. The second dielectric layer 15 has a cavity 16 formed therein.

The second dielectric layer 15 may be formed by a chemical vapor deposition process. For example, the second dielectric layer 15 may be made of any one of silicon oxide, silicon nitride and silicon oxynitride, or combinations thereof.

The material of the second dielectric layer 15 may be deposited within the first trench 111 as well as on the first surface 101 of the substrate 10. In some embodiments, through a process with a high deposition rate, the second dielectric layer 15 may close the opening of the first trench 111 before the first trench 111 is fully filled, thus forming the cavity 16 therein. The present disclosure is not limited to any particular deposition rate, and those skilled in the art may, in light of the teachings here, select a proper deposition rate which allows the formation of a desired cavity 16. In some embodiments, the deposition rate may be adjusted to form different desired cavities 16.

The deposition of the second dielectric layer 15 may be followed by a planarization process for removing the portion of the second dielectric layer 15 above the first surface 101, and retaining the other portion of the second dielectric layer within the first trench 101. The cavity 16 is contained in the retained second dielectric layer 17, as shown in FIG. 8. In some embodiments, the cavity 16 accounts for 5% or more of a volume of the second dielectric layer 17.

In some embodiments, the cavity 16 has a maximum height "b" and a maximum width "a." The maximum width "a" is measured parallel to the first surface 101, while the maximum height "b" is measured perpendicular to the first surface 101. For the sake of simple fabrication, the maximum height "b" may be greater than the maximum width "a."

According to the present disclosure, the cavity 16 formed in the second dielectric layer 17 overlying the gate layer 14 can effectively mitigate the mechanical stress and reduce defects that may be introduced into the second dielectric layer 17 by thermal processes. While no thermal process such as annealing has been mentioned above, the fabrication of the memory transistor involves some kinds of thermal processes, and the adverse influence thereof can be suppressed by the existence of the cavity 16. Furthermore, the introduction of the cavity 16 can reduce parasitic capacitance, thereby improving the performance of the memory transistor.

Figure 9:
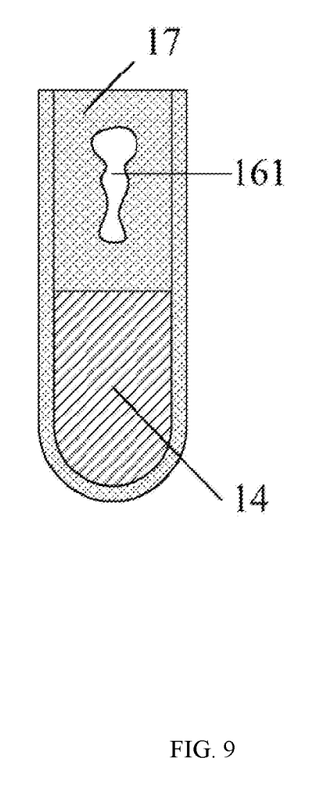
FIG. 9 is a schematic diagram showing an exemplary formed cavity in accordance with some embodiments of the present disclosure.

While the cavity 16 shown in FIG. 8 has a shape of oval, other shapes of the cavity 16 are also possible according to various embodiments of the present disclosure. Exemplary suitable shapes of the cavity 16 will be described below with reference to FIGS. 9-11. FIG. 9 is a schematic diagram showing an exemplary formed cavity in accordance with some embodiments of the present disclosure. In the embodiment illustrated in FIG. 9, the cavity 161 may be of an irregular shape that has multiple broad portions and multiple narrow portions along the longitude. For example, the cavity 161 may be a longitudinally elongated cavity (e.g., in the direction perpendicular to the first surface 101, having an upper end proximal to the first surface 101 and a lower end distal from the first surface 101).

Figure 10:
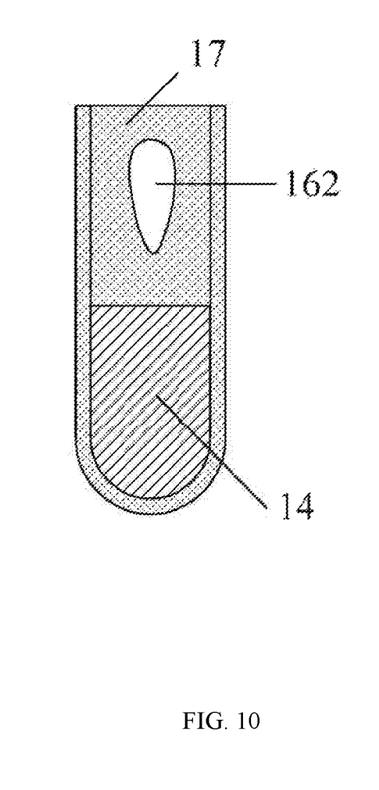
FIG. 10 is a schematic diagram showing another exemplary formed cavity in accordance with some embodiments of the present disclosure.

FIG. 10 is a schematic diagram showing another exemplary formed cavity in accordance with some embodiments of the present disclosure. In the embodiment illustrated in FIG. 10, the cavity 162 has a droplet-like shape with a broader upper portion and a narrower lower portion. In other embodiments, the cavity 162 may be of a droplet-like shape with a narrower upper portion and a broader lower portion.

Figure 11:
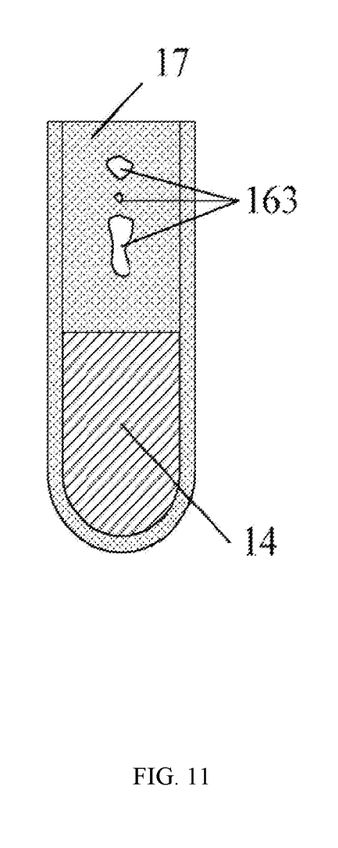
FIG. 11 is a schematic diagram showing yet another exemplary formed cavity in accordance with some embodiments of the present disclosure.

FIG. 11 is a schematic diagram showing yet another exemplary formed cavity in accordance with some embodiments of the present disclosure. In the embodiment illustrated in FIG. 11, the cavity 163 is composed of multiple separate parts arranged one by one longitudinally or transversely (i.e., parallel to the first surface 101). In some embodiments, the cavity 163 may also be composed of separate parts arranged side by side longitudinally and other separate parts arranged side by side transversely. In some embodiments, the cavity 163 may include an array of separate parts. In some embodiments, the separate parts have different sizes and shapes.

While several different shapes and different constituent distributions of the cavity have been presented above by way of examples, the present disclosure is not limited to those disclosed herein and various cavities with other shapes and constituent distributions may be formed according to practical needs.

Figure 12:
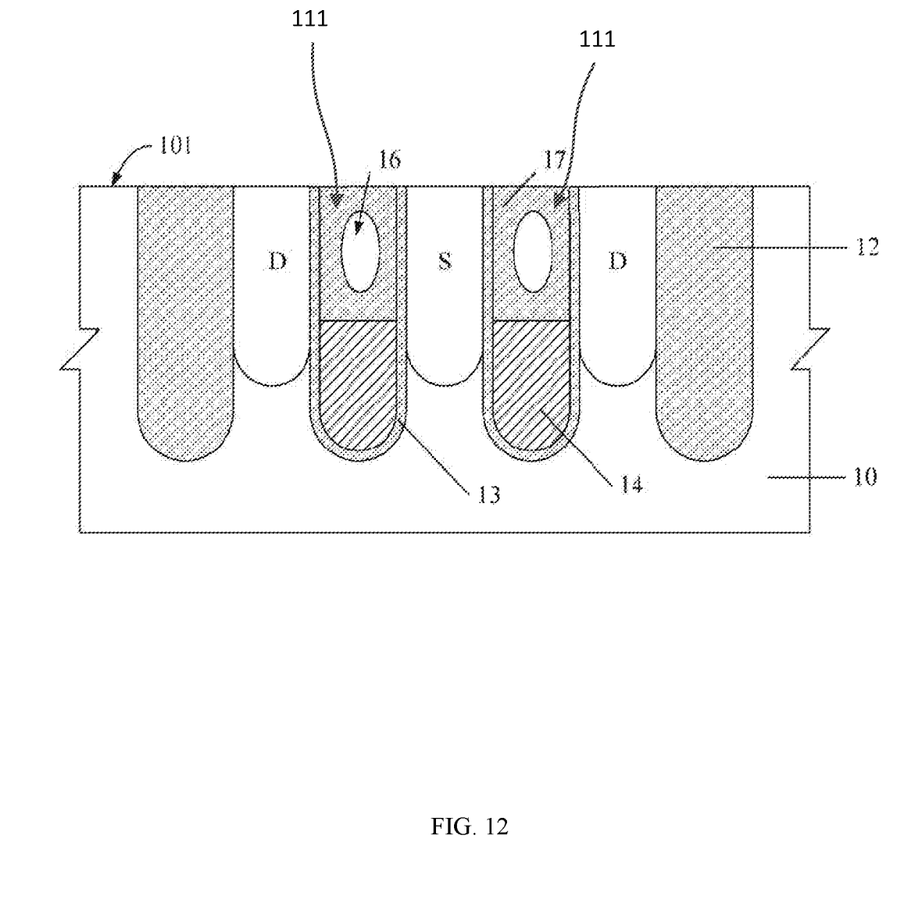
FIG. 12 is a schematic diagram showing formation of a source region and a drain region in accordance with an embodiment of the present disclosure.

Referring to FIG. 12, a schematic diagram shows formation of a source region and a drain region in accordance with an embodiment of the present disclosure. A source region and a drain region may be formed within the substrate 10 in step S16 (not shown in FIG. 2) following step S15. Each of the source region S and the drain region D is located on one side of the first trench 111. A depth of bottoms of the source and drain regions with respect to the first surface 101 in the substrate 10 may be greater than a depth of the top surface of the gate layer 14 with respect to the first surface 101 in the substrate 10. As shown in FIG. 12, the cavity 16 formed in the second dielectric layer 17 is located between the source region S and the drain region D. That is, the source region S, the cavity 16 and the drain region D may be arranged in a horizontal row in parallel to the first surface 101. In this way, the parasitic capacitance between the source region S and the drain region D may be reduced.

In some embodiments, the source region S and the drain region D may be formed by ion implantation, and the types, doses and energy levels of the implanted ions may be selected properly according to practical needs.

In some embodiments, there may be multiple first trenches 111 in the substrate 10, and two adjacent ones of the first trenches 111 may share one source region S or one drain region D. In the embodiment shown in FIG. 12, two adjacent ones of the first trenches 111 share a source region S.

Referring back to FIGS. 3-12, a memory transistor may include:

a substrate 10 comprising a first surface 101, a second surface 102 opposing the first surface 101 and a first trench 111 having a top opening formed in the first surface 101;

a first dielectric layer 13 formed on an inner surface of the first trench 111;

a gate layer 14 formed on the first dielectric layer 13 in the first trench 111, wherein a top surface of the gate layer 14 is lower than the first surface 101; and a second dielectric layer 17, which is filled in the first trench 111 and located on the top surface of the gate layer 14, the second dielectric layer 17 covering the gate layer 14 and connecting to the first dielectric layer 13, the second dielectric layer 17 having a cavity 16 formed therein.

In some embodiments, the cavity 16 may account for 5% or more of a volume of the second dielectric layer 17.

In some embodiments, the cavity 16 may have a maximum height "b" measured perpendicular to the first surface 101 and a maximum width "a" measured parallel to the first surface 101.

In some embodiments, the value of the maximum height may be greater than that of the maximum width.

In some embodiments, the first dielectric layer 13 may be made of a material comprising silicon oxide.

In some embodiments, the second dielectric layer 17 may be made of a material comprising any one of silicon oxide, silicon nitride and silicon oxynitride, or combinations thereof.

The memory transistor may further include a source region S and a drain region D. The source region S and the drain region D may sandwich the first trench 111 therebetween and a depth of bottoms of the source and drain regions with respect to the first surface 101 in the substrate 10 may be greater than a depth of the top surface of the gate layer 14 with respect to the first surface 101 in the substrate 10.

In some embodiments, there may be multiple first trenches 111, in which every two adjacent ones of the first trenches 111 share a source region S or a drain region D.

In some embodiments, the memory transistor may further include second trenches 112 which surround the first trench 111, the source region S and the drain region D, and are filled with an insulating material 12.

The present disclosure also provides a semiconductor device, comprising:

a substrate having a first surface and a second surface opposing the first surface, the substrate further comprising a first trench having a top opening formed in the first surface and bottomed away from the first surface;

a first material layer formed on an inner surface of the first trench;

a second material layer formed on the first material layer in the first trench, the second material layer having a first top surface lower than the first surface, where the second material layer may be a gate layer used to construct a memory transistor; and a third material layer formed within the first trench and covering the second material layer and the first material layer, the third material layer having a second top surface and a cavity formed therein, the cavity located between the first top surface and the second top surface.

In the memory transistor provided in the present disclosure, the second dielectric layer is formed within the first trench and overlies the first dielectric layer. Moreover, the second dielectric layer has a cavity formed therein. As a result, the memory transistor has a significantly reduced mechanical stress as well as fewer defects that may be introduced into the second dielectric layer by thermal processes. Furthermore, the introduction of the cavity can reduce parasitic capacitance and hence improve performance of the memory transistor.

The description presented above is merely some preferred embodiments of the present disclosure and does not limit the scope thereof in any sense. Any and all changes and modifications made by those of ordinary skill in the art based on the above teachings fall within the scope as defined in the appended claims.

What is claimed is:

1. A memory transistor, comprising:
a substrate comprising a first surface and a second surface opposing the first surface, the substrate further comprising a first trench having an opening formed in the first surface;
a first dielectric layer formed on an inner surface of the first trench;
a gate layer formed on the first dielectric layer in the first trench, the gate layer having a top surface lower than the first surface;
a second dielectric layer filled in the first trench and located on the top surface of the gate layer, the second dielectric layer covering the gate layer and connecting to the first dielectric layer, the second dielectric layer having a cavity formed therein,
wherein the substrate further comprises a source region and a drain region, each of the source and drain regions located on one side of the first trench, and wherein the cavity is located between the source region and the drain region; and
a second trench filled with an insulating material, wherein the second trench has a substantially same depth as the first trench measured from the first surface of the substrate, the second trench and the first trench are respectively located on opposing sides of and adjacent to one of the source region and the drain region, and there is no cavity formed in the second trench.

2. The memory transistor of claim 1, wherein the cavity accounts for 5% or more of a volume of the second dielectric layer.

3. The memory transistor of claim 1, wherein the cavity comprises a maximum height measured perpendicular to the first surface and a maximum width measured parallel to the first surface, and wherein the maximum height is greater than the maximum width.

4. The memory transistor of claim 1, wherein the first dielectric layer is made of a material comprising silicon oxide.

5. The memory transistor of claim 1, wherein the second dielectric layer is made of a material comprising any one of silicon oxide, silicon nitride and silicon oxynitride, or combinations thereof.

6. The memory transistor of claim 1, wherein a depth of bottoms of the source and drain regions with respect to the first surface in the substrate is greater than a depth of the top surface of the gate layer with respect to the first surface in the substrate.

7. The memory transistor of claim 6, further comprising:
a plurality of first trenches, two adjacent ones of the first trenches sharing one of the source region and the drain region.

8. A method for fabricating a memory transistor, comprising:
providing a substrate comprising a first surface and a second surface opposing the first surface;
forming a first trench in the substrate, the first trench having an opening formed in the first surface;
forming a first dielectric layer on an inner surface of the first trench;
forming a gate layer on the first dielectric layer in the first trench, the gate layer having a top surface lower than the first surface;

filling the first trench with a second dielectric layer, the second dielectric layer located on the top surface of the gate layer, the second dielectric layer covering the gate layer and connecting to the first dielectric layer, the second dielectric layer having a cavity formed therein, and subsequent to the filling of the second dielectric layer, forming a source region and a drain region in the substrate, each of the source and drain regions located on one side of the first trench, and wherein the cavity is located between the source region and the drain region, wherein the method further comprises, prior to the formation of the first trench in the substrate:

forming a second trench in the substrate, the second trench having an opening toward the first surface and a bottom away from the first surface, wherein the second trench has a substantially same depth as the first trench measured from the first surface of the substrate, and the second trench and the first trench are respectively located on opposing sides of and adjacent to one of the source region and the drain region; and filling the second trench with an insulating material, wherein there is no cavity formed in the second trench.

9. The method of claim 8, wherein the cavity accounts for 5% or more of a volume of the second dielectric layer.

10. The method of claim 8, wherein a depth of bottoms of the source and drain regions with respect to the first surface in the substrate is greater than a depth of the top surface of the gate layer with respect to the first surface in the substrate.

11. A semiconductor device, comprising:
a substrate comprising a first surface and a second surface opposing the first surface, the substrate further comprising a first trench having an opening formed in the first surface and a bottom away from the first surface;
a first material layer formed on an inner surface of the first trench;
a second material layer formed on the first material layer in the first trench, the second material layer having a first top surface lower than the first surface;
a third material layer formed within the first trench and covering the second material layer and the first material layer, the third material layer having a second top surface and having a cavity formed therein, the cavity located between the first top surface and the second top surface,
wherein the second material layer is a gate layer, the gate layer used to construct a memory transistor, and
wherein the substrate further comprises a source region and a drain region, each of the source and drain regions located on one side of the first trench, and wherein the cavity is located between the source region and the drain region; and
a second trench filled with an insulating material, wherein the second trench has a substantially same depth as the first trench measured from the first surface of the substrate, the second trench and the first trench are respectively located on opposing sides of and adjacent to one of the source region and the drain region, and there is no cavity formed in the second trench.

12. The semiconductor device of claim 11, wherein the cavity accounts for 5% or more of a volume of the third material layer.

13. The semiconductor device of claim 11, wherein the cavity comprises a maximum height measured perpendicular to the first surface and a maximum width measured parallel to the first surface, and wherein the maximum height is greater than the maximum width.

14. The semiconductor device of claim 11, wherein the first material layer is made of a material comprising silicon oxide.

15. The semiconductor device of claim 11, wherein the third material layer is made of a material comprising any one of silicon oxide, silicon nitride and silicon oxynitride, or combinations thereof.

16. The semiconductor device of claim 11, wherein a depth of bottoms of the source and drain regions with respect to the first surface in the substrate is greater than a depth of the top surface of the gate layer with respect to the first surface in the substrate.

17. The semiconductor device of claim 16, comprising a plurality of first trenches, two adjacent ones of the first trenches sharing one of the source region and the drain region.

* * * * *